United States Patent
Bo

(10) Patent No.: US 12,382,720 B2
(45) Date of Patent: Aug. 5, 2025

(54) ARRAY SUBSTRATE AND MANUFACTURING METHOD FOR THE SAME

(71) Applicants: HUIZHOU CHINA STAR OPTOELECTRONICS DISPLAY CO., LTD., Guangdong (CN); TCL CHINA STAR OPTOELECTRONICS TECHNOLOGY CO., LTD., Guangdong (CN)

(72) Inventor: Meilan Bo, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/777,041

(22) PCT Filed: Apr. 18, 2022

(86) PCT No.: PCT/CN2022/087410
§ 371 (c)(1),
(2) Date: May 15, 2022

(87) PCT Pub. No.: WO2023/184613
PCT Pub. Date: Oct. 5, 2023

(65) Prior Publication Data
US 2025/0015099 A1   Jan. 9, 2025

(30) Foreign Application Priority Data
Apr. 1, 2022   (CN) .......................... 202210348679.8

(51) Int. Cl.
*H01L 21/34* (2025.01)
*H10D 30/67* (2025.01)
(Continued)

(52) U.S. Cl.
CPC ..... *H10D 86/0231* (2025.01); *H10D 30/6723* (2025.01); *H10D 30/6755* (2025.01);
(Continued)

(58) Field of Classification Search
CPC . H01L 27/1288; H01L 27/12; H01L 27/1225; H01L 27/127; H01L 29/78633;
(Continued)

(56) References Cited

U.S. PATENT DOCUMENTS

| 9,607,996 B2* | 3/2017 | Katoh | ............... H01L 29/78678 |
| 2016/0293613 A1* | 10/2016 | Katoh | .................... H10B 20/25 |
| 2018/0212062 A1 | 7/2018 | Xie | |

FOREIGN PATENT DOCUMENTS

| CN | 201886250 U | 6/2011 |
| CN | 107731882 A | 2/2018 |

(Continued)

OTHER PUBLICATIONS

Chinese Office Action issued in corresponding Chinese Patent Application No. 202210348679.8 dated Jun. 27, 2024, pp. 1-9.
(Continued)

*Primary Examiner* — Nikolay K Yushin
(74) *Attorney, Agent, or Firm* — Nathan & Associates; Menachem Nathan

(57) ABSTRACT

The present disclosure provides an array substrate and a manufacturing method for the array substrate. The manufacturing method includes: forming a light-shielding layer, a source, and a drain on the substrate by using a first photomask; forming a semiconductor layer, a gate insulating layer, and a gate which are laminated on the source, the drain, and light-shielding layer by using a second photomask; forming a dielectric layer on the gate and the substrate, and a via hole exposing the drain on the dielectric layer by using a third photomask; and forming a pixel (Continued)

electrode on the dielectric layer by using a fourth photomask.

20 Claims, 7 Drawing Sheets

(51) Int. Cl.
*H10D 86/01* (2025.01)
*H10D 86/40* (2025.01)
*H10D 86/60* (2025.01)
G02F 1/1362 (2006.01)
G02F 1/1368 (2006.01)

(52) U.S. Cl.
CPC ....... *H10D 86/0221* (2025.01); *H10D 86/423* (2025.01); *H10D 86/60* (2025.01); *G02F 1/136209* (2013.01); *G02F 1/1368* (2013.01)

(58) Field of Classification Search
CPC ............... H01L 29/786; H01L 29/7869; G02F 1/136209; G02F 1/1362; G02F 1/1368; G02F 1/136277; H10D 86/0231; H10D 86/01; H10D 86/0221; H10D 86/423; H10D 86/40; H10D 86/60; H10D 30/6723; H10D 30/67; H10D 30/6755; H10D 30/6757; H10D 99/00
See application file for complete search history.

(56) References Cited

FOREIGN PATENT DOCUMENTS

| | | |
|---|---|---|
| CN | 108550581 A | 9/2018 |
| CN | 109037241 A | 12/2018 |
| CN | 109300917 A | 2/2019 |
| CN | 109585304 A | 4/2019 |
| KR | 20020002051 A | 1/2002 |
| KR | 100648214 B1 | 11/2006 |

OTHER PUBLICATIONS

International Search Report in International application No. PCT/CN2022/087410, mailed on Dec. 15, 2022.
Written Opinion of the International Search Authority in International application No. PCT/CN2022/087410, mailed on Dec. 15, 2022.
Chinese Office Action issued in corresponding Chinese Patent Application No. 202210348679.8 dated Mar. 8, 2025, pp. 1-10.

* cited by examiner providing a substrate; and forming a light-shielding layer on the substrate, and a source and a drain on a side of the light-shielding layer away from the substrate by a first photomask process — S1 forming a semiconductor layer, a gate insulating layer, and a gate which are laminated on the source, the drain, and the light-shielding layer by a second photomask process — S2 forming a dielectric layer on the gate and the substrate, and forming a via hole exposing the drain on the dielectric layer by a third photomask process — S3 forming a pixel electrode on the dielectric layer by a fourth photomask process, wherein the pixel electrode is electrically connected to the drain through the via hole — S4

FIG. 1

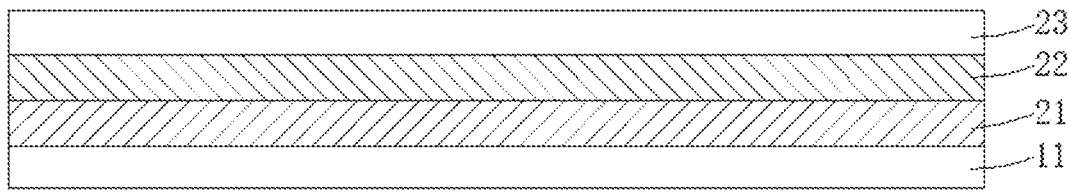

FIG. 2A

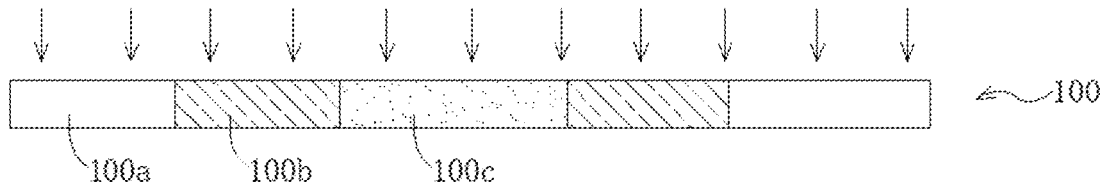

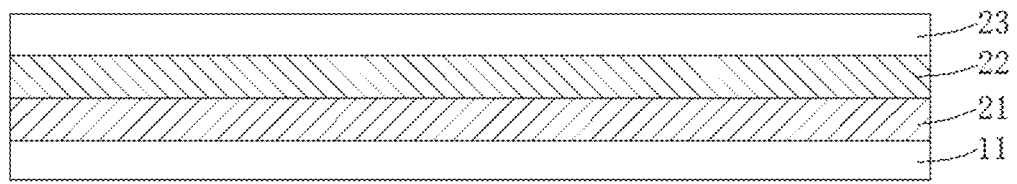

FIG. 2B

ARRAY SUBSTRATE AND MANUFACTURING METHOD FOR THE SAME

TECHNICAL FIELD

The present disclosure relates to a technical field of display technology, and in particular, to an array substrate and a manufacturing method for the same.

BACKGROUND

With development of display technology, flat panel displays such as thin film transistor liquid crystal display (TFT-LCD) have advantages in high image quality, power saving, thin body, and widely application; and are widely used in various electronic products such as mobile phones, televisions, personal digital assistants, digital cameras, notebook computers, and desktop computers. The flat panel displays have become a mainstream of display devices.

At present, a size of a display panel has become larger and larger, and a carrier mobility of a conventional hydrogenated amorphous silicon (a-Si:H) thin film transistor is not high enough to drive a large-size liquid crystal display panel. In general, an indium gallium zinc oxide (IGZO) thin film transistor has a significantly higher carrier mobility than an a-Si:H thin film transistor. To improve a charging rate of a device with a thin film transistor, an IGZO semiconductor layer gradually replaces an a-Si:H semiconductor layer, and is applied to the design of the large-size liquid crystal display panel.

However, at present, an array substrate either including the IGZO semiconductor layer or a semiconductor layer formed by another metal oxide is prepared by depositing, exposing, developing, etching, stripping each film layer. A large number of photomasks are used in the preparation, thus, the manufacturing cost is high. Taking the array substrate with a gate in top as an example, generally, six photomask processes are required in manufacturing, which is complex and costs high.

Accordingly, it is necessary to provide a technical solution to solve the above problems.

Technical Problems

The present disclosure provides an array substrate and a manufacturing method for the array substrate, which can solve a technical problem that a conventional manufacturing method for a conventional array substrate is complex and costs high.

SUMMARY

To solve the above problems, the embodiments of the present disclosure provide:

A manufacturing method for an array substrate, comprising:
  S1, providing a substrate; and forming a light-shielding layer on the substrate, and a source and a drain on a side of the light-shielding layer away from the substrate by a first photomask process;
  S2, forming a semiconductor layer, a gate insulating layer, and a gate which are laminated on the source, the drain, and the light-shielding layer by a second photomask process;
  S3, forming a dielectric layer on the gate and the substrate, and forming a via hole exposing the drain on the dielectric layer by a third photomask process; and;
  S4, forming a pixel electrode on the dielectric layer by a fourth photomask process, wherein the pixel electrode is electrically connected to the drain through the via hole.

Optionally, in some embodiments of the present disclosure, the S1 comprises:
  S101, laminating a light-shielding film, a first metal film, and a first photoresist film sequentially on the substrate;
  S102, exposing the first photoresist film, the first metal film, and the light-shielding film by using a first photomask; wherein the first photomask includes a fully transparent region, a partially transparent region, and a non-transparent region;
  S103, removing regions of the first photoresist film and the first metal film corresponding to the fully transparent region and the partially transparent region to form the source and the drain;
  S104, removing a region of the light-shielding film corresponding to the fully transparent region to form the light-shielding layer; and
  S105, removing a remaining portion of the first photoresist film.

Optionally, in some embodiments of the present disclosure, a material of the light-shielding layer is a non-metallic light-shielding material.

Optionally, in some embodiments of the present disclosure, the S2 comprises:
  S201, forming a semiconductor film on the source, the drain, the light-shielding layer, and the substrate; wherein the semiconductor film includes a conductive region corresponding to the source and the drain;
  S202, conducting a portion of the semiconductor film corresponding to the conductive region to form a conductor region;
  S203, forming a gate insulating film, a second metal film, and a second photoresist film sequentially on the semiconductor film;
  S204, exposing the second photoresist film, the second metal film, the gate insulating film, and the semiconductor film by using a second photomask; wherein the second photomask includes a fully transparent region and a non-transparent region;
  S205, removing regions of the second photoresist film, the second metal film, the gate insulating film, and the semiconductor film corresponding to the fully transparent region to form the gate, the gate insulating layer, and the semiconductor layer, respectively; and
  S206, removing a remaining portion of the second photoresist film.

Optionally, in some embodiments of the present disclosure, the gate, the gate insulating layer, and the semiconductor layer are shaped in a stacked structure in a direction perpendicular to the substrate, and an edge of the stacked structure is overlapped with the source and the drain;
  wherein orthographic projections of the gate insulating layer and the gate on the substrate are in an orthographic projection of the semiconductor layer on the substrate.

Embodiments of the present disclosure further provide an array substrate, comprising:
a substrate;
a source disposed on the substrate;
a drain disposed on the substrate and in a same layer with the source, wherein the drain is spaced apart from the source;
a semiconductor layer disposed between the source and the drain, and provided with an edge extended to a side of the source away from the substrate and a side of the drain away from the substrate;
a gate insulating layer disposed on a side of the semiconductor layer away from the substrate; and
a gate disposed on a side of the gate insulating layer away from the substrate;
wherein the gate, the gate insulating layer, and the semiconductor layer are shaped in a stacked structure in a direction perpendicular to the substrate, and an edge of the stacked structure is overlapped with the source and the drain.

Optionally, in some embodiments of the present disclosure, edges of the semiconductor layer, the gate insulating layer, and the gate are overlapped with the source and drain in the direction perpendicular to the substrate.

Optionally, in some embodiments of the present disclosure, orthographic projections of the gate insulating layer and the gate on the substrate are in an orthographic projection of the semiconductor layer on the substrate.

Optionally, in some embodiments of the present disclosure, the orthographic projection of the gate on the substrate is in the orthographic projection of the gate insulating layer on the substrate.

Optionally, in some embodiments of the present disclosure, the array substrate further comprises a dielectric layer and a pixel electrode, the dielectric layer is disposed on a side of the gate away from the substrate, and the pixel electrode is disposed on a side of the dielectric layer away from the substrate;
wherein the semiconductor layer comprises a channel region and a conductor region, the channel region is correspondingly located between the source and the drain, the conductor region is located on both sides of the channel region and contacts the source and the drain, respectively;
wherein the drain includes a first contact region and a second contact region, the first contact region is spaced apart from the second contact region, the second contact region is located on a side of the first contact region away from the source, the conductor region corresponding to the drain contacts the first contact region, and the pixel electrode contacts the second contact region.

Optionally, in some embodiments of the present disclosure, the array substrate further comprises a light-shielding layer between the substrate and the source, and between the substrate and the drain; the source and the drain are disposed on a side of the light-shielding layer away from the substrate;
wherein the conductor region corresponding to the source contacts the light-shielding layer along a surface of the side of the source away from the substrate to a surface of a side of the source close to the drain; the conductor region corresponding to the drain contacts the light-shielding layer along a surface of the side of the drain away from the substrate to a surface of a side of the drain close to the source.

Optionally, in some embodiments of the present disclosure, a material of the light-shielding layer is a non-metallic light-shielding material.

An embodiment of the present disclosure further provides an array substrate, comprising:
a substrate;
a source disposed on the substrate;
a drain disposed on the substrate and in a same layer with the source, wherein the drain is spaced apart from the source;
a semiconductor layer disposed between the source and the drain, and provided with an edge extended to a side of the source away from the substrate and a side of the drain away from the substrate;
a gate insulating layer disposed on a side of the semiconductor layer away from the substrate; and
a gate disposed on a side of the gate insulating layer away from the substrate;
wherein the gate, the gate insulating layer, and the semiconductor layer are shaped in a stacked structure in a direction perpendicular to the substrate, and an edge of the stacked structure is overlapped with the source and the drain, wherein the gate, the gate insulating layer, and the semiconductor layer are formed by a same photomask process.

Optionally, in some embodiments of the present disclosure, edges of the semiconductor layer, the gate insulating layer, and the gate are overlapped with the source and drain in the direction perpendicular to the substrate.

Optionally, in some embodiments of the present disclosure, orthographic projections of the gate insulating layer and the gate on the substrate are in an orthographic projection of the semiconductor layer on the substrate.

Optionally, in some embodiments of the present disclosure, the orthographic projection of the gate on the substrate is in the orthographic projection of the gate insulating layer on the substrate.

Optionally, in some embodiments of the present disclosure, the array substrate further comprises a dielectric layer and a pixel electrode, the dielectric layer is disposed on a side of the gate away from the substrate, and the pixel electrode is disposed on a side of the dielectric layer away from the substrate;
wherein the semiconductor layer comprises a channel region and a conductor region, the channel region is correspondingly located between the source and the drain, the conductor region is located on both sides of the channel region and contacts the source and the drain, respectively;
wherein the drain includes a first contact region and a second contact region, the first contact region is spaced apart from the second contact region, the second contact region is located on a side of the first contact region away from the source, the conductor region corresponding to the drain contacts the first contact region, and the pixel electrode contacts the second contact region.

Optionally, in some embodiments of the present disclosure, the array substrate further comprises a light-shielding layer between the substrate and the source, and between the substrate and the drain; the source and the drain are disposed on a side of the light-shielding layer away from the substrate;
wherein the conductor region corresponding to the source contacts the light-shielding layer along a surface of the side of the source away from the substrate to a surface of a side of the source close to the drain; the conductor region corresponding to the drain contacts the light-shielding layer along a surface of the side of the drain away from the substrate to a surface of a side of the drain close to the source.

Optionally, in some embodiments of the present disclosure, a material of the light-shielding layer is a non-metallic light-shielding material.

Optionally, in some embodiments of the present disclosure, the material of the light-shielding layer is a black matrix.

BENEFICIAL EFFECTS

According to an array substrate and a manufacturing method for the array substrate provided in the present disclosure, a light-shielding layer, a source and a drain are formed by a first photomask process; a semiconductor layer, a gate insulating layer and a gate which are laminated are formed by a second photomask process; a via hole exposing the drain is formed on a dielectric layer by a third photomask process; and a pixel electrode is formed by a fourth photomask process. According to the present disclosure, since the source, the drain and the light-shielding layer are formed by using a same photomask, another photomask process can be saved. Meanwhile, the semiconductor layer, the gate insulating layer, and the gate are also formed by using a same photomask, thus, another photomask process can be saved. Therefore, the present disclosure can complete the processes for manufacturing the array substrate only by four photomask processes, thereby reducing the number of photomasks used, simplifying the manufacturing process, and reducing the production cost.

BRIEF DESCRIPTION OF THE DRAWINGS

In order to more clearly illustrate the technical solutions in the embodiments of the present disclosure, the accompanying drawings required in the embodiments will be briefly described below. It is obvious that the accompanying drawings are merely for describing some embodiments of the present disclosure, and other drawings may be obtained by those skilled in the art without creative efforts.

FIG. 1 is a flowchart of a manufacturing method for an array substrate according to an embodiment of the present disclosure.

DETAILED DESCRIPTION OF THE EMBODIMENTS

The technical solutions in the embodiments of the present disclosure will now be clearly and completely described in conjunction with the accompanying drawings. It is apparent that the described embodiments are only some but not all of the embodiments of the present disclosure. Based on the embodiments of the present disclosure, all other embodiments obtained by those skilled in the art without creative efforts are within the scope of the present disclosure. Furthermore, it should be understood that the specific embodiments described herein are merely intended to illustrate and explain the present disclosure, and are not intended to limit the present disclosure. In the present disclosure, unless otherwise stated, the terms for describing the location such as "up" and "down" generally refer to the up and down direction of the device in actual use or in working state, specifically refer to the up and down direction of the accompanying drawings; and the terms "in" and "out" refer to the profile of the device.

Figure 2C:
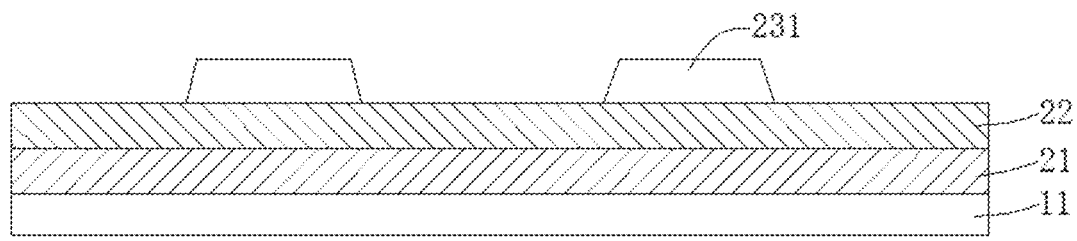
FIG. 2A-FIG. 2Q are schematic diagrams of processes for manufacturing an array substrate according to an embodiment of the present disclosure.
Figure 2D:
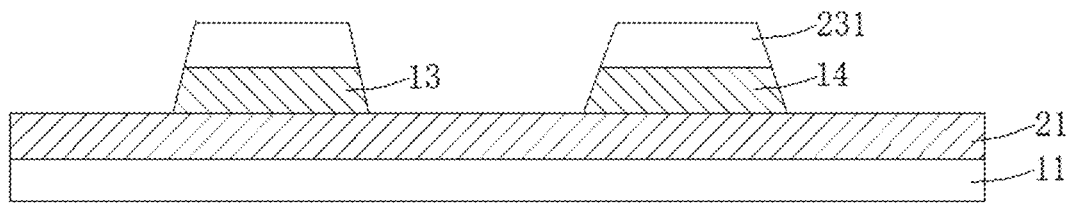
Figure 2E:
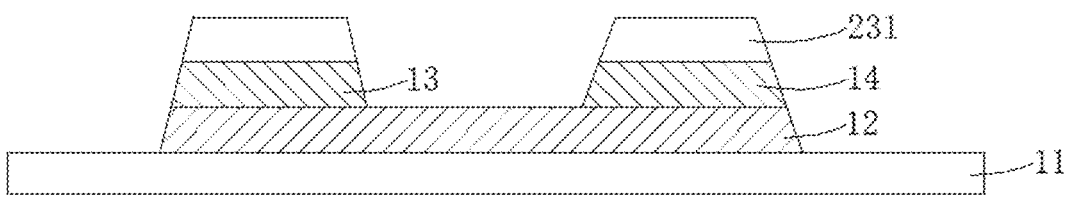
Figure 2F:
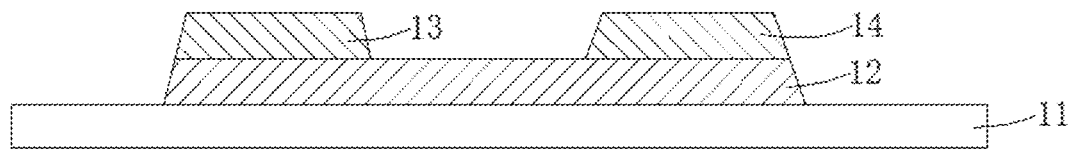
Figure 2G:
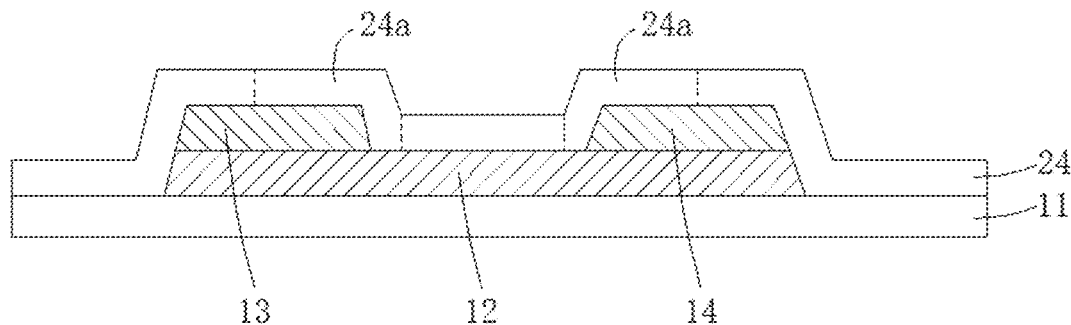
Figure 2H:
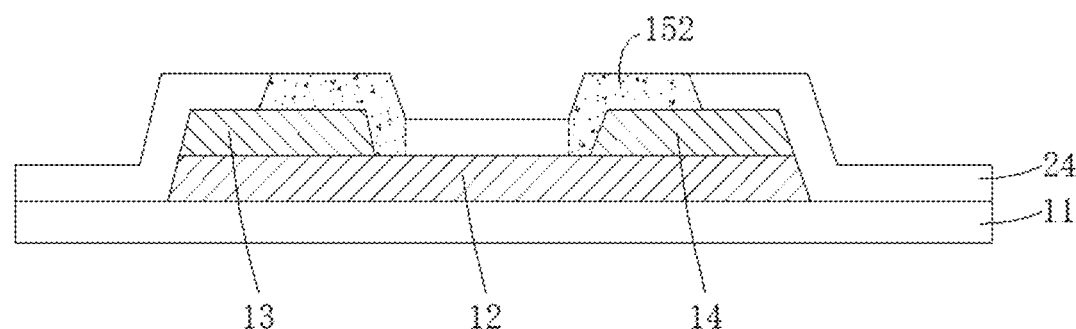
Figure 2I:
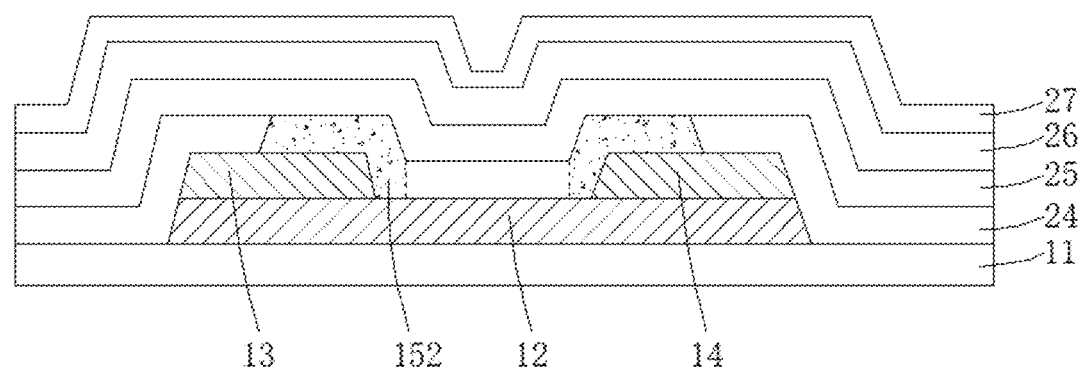
Figure 2J:
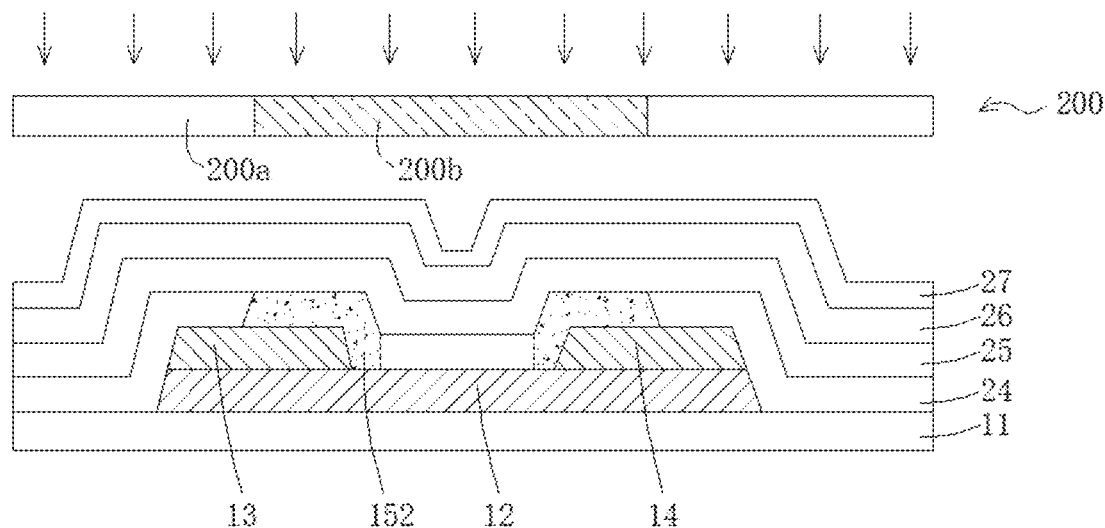
Figure 2K:
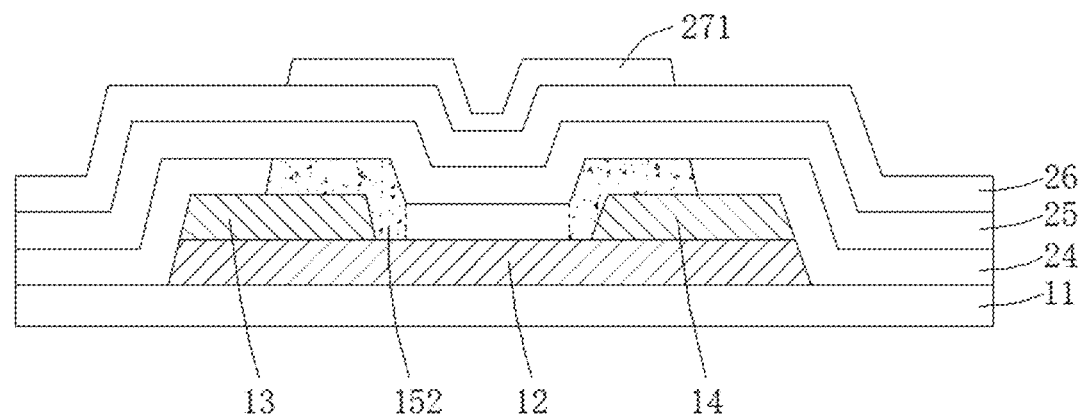
Figure 2L:
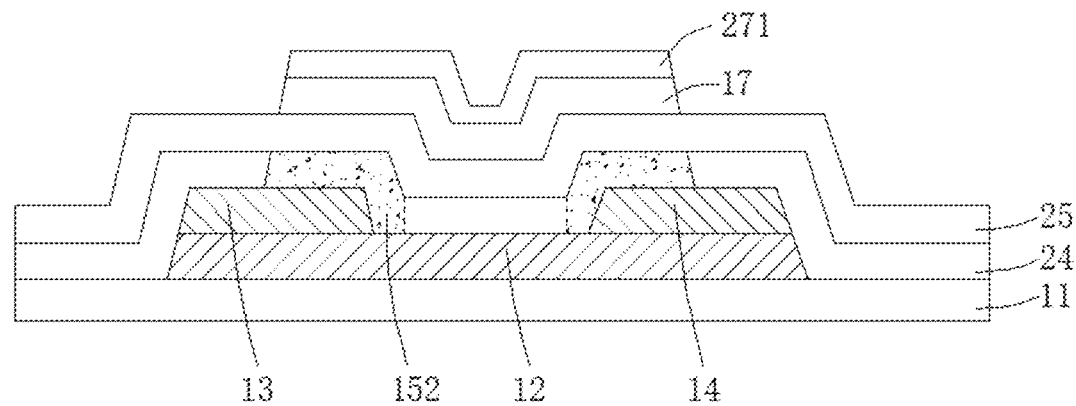
Figure 2M:
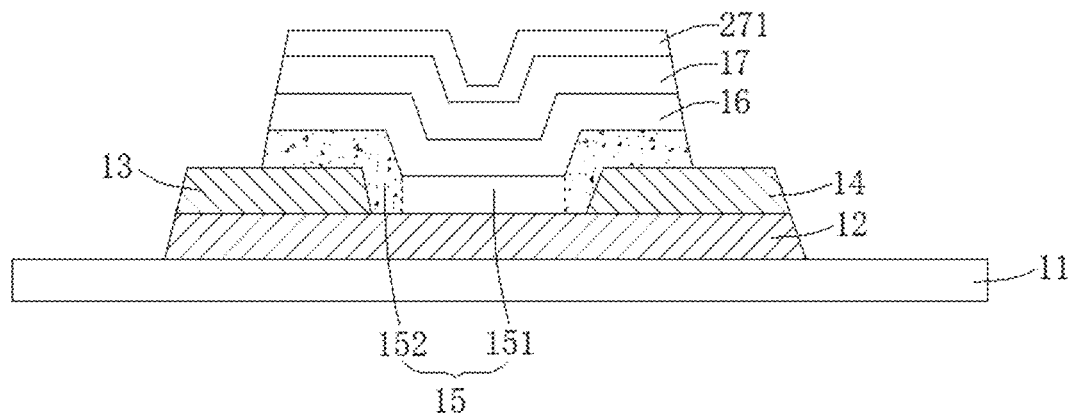
Figure 2N:
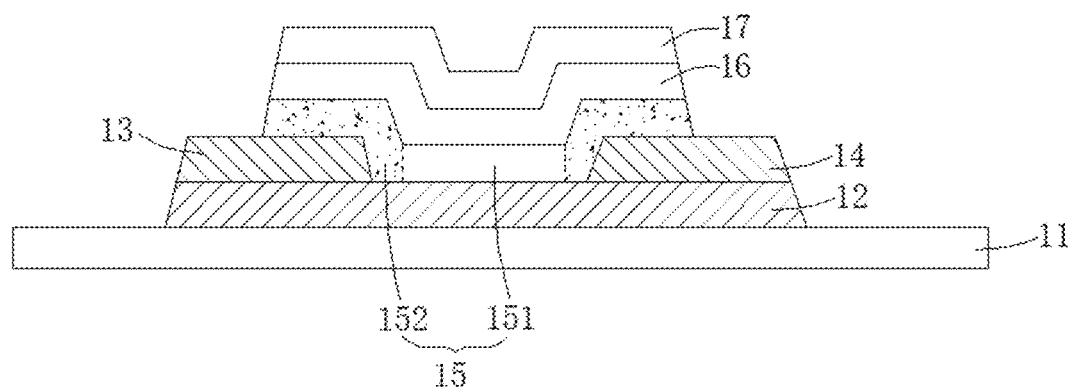
Figure 2O:
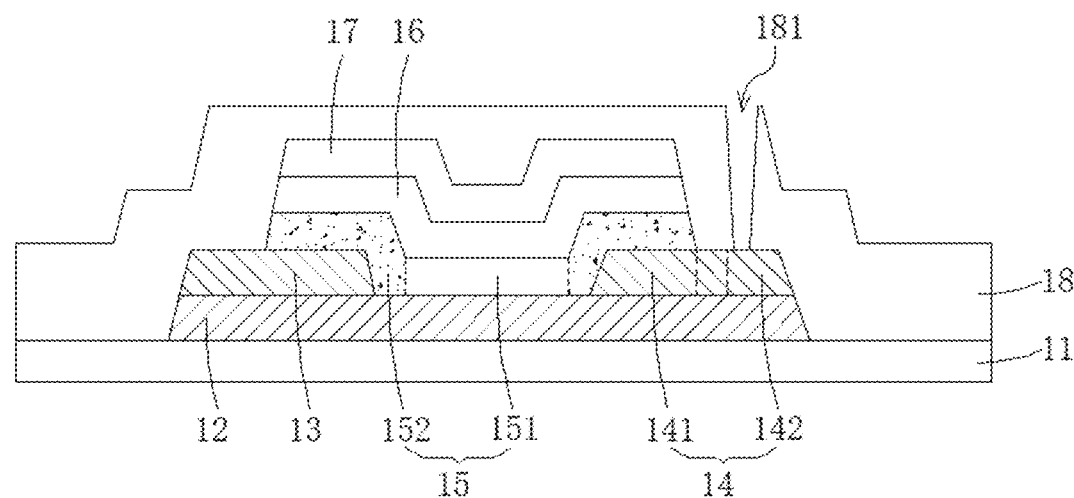
Figure 2P:
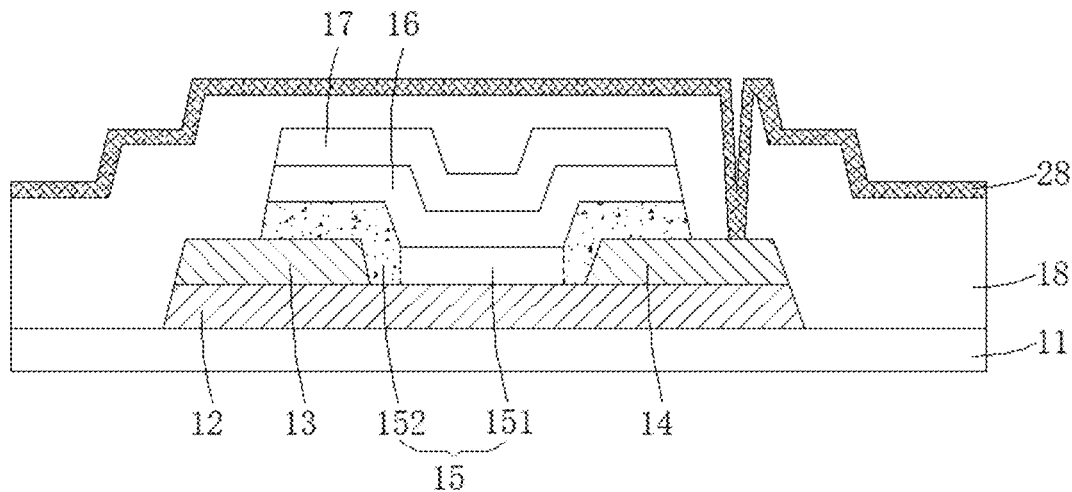
Figure 2Q:
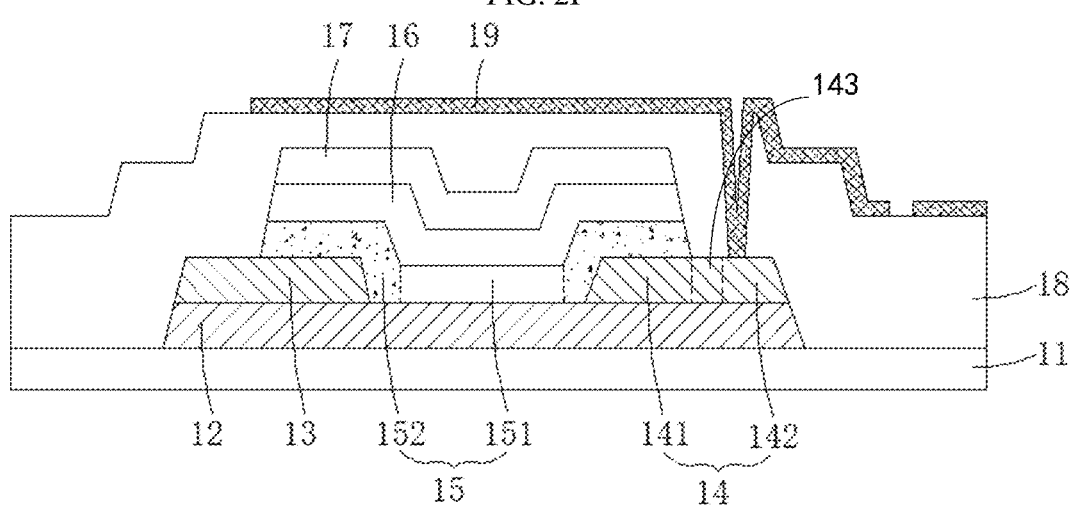

Referring to FIG. 1, and FIG. 2A-FIG. 2Q, a manufacturing method for an array substrate is provided according to an embodiment of the present disclosure, wherein the manufacturing method includes the following steps S1-S4.

S1, providing a substrate; and forming a light-shielding layer on the substrate, and a source and a drain on a side of the light-shielding layer away from the substrate by a first photomask process.

Specifically, the S1 comprises the following steps S101-S105.

S101, as shown in FIG. 2A, laminating a light-shielding film 21, a first metal film 22, and a first photoresist film 23 sequentially on the substrate 11.

The light-shielding film 21 is a non-metallic light-shielding material, such as a black matrix, but is not limited thereto. A thickness of the light-shielding film ranges from 500 A to 2000 A. A material of the first metal film 22 may be at least one of molybdenum, aluminum, copper, and titanium, and a thickness of the first metal film 22 ranges from 2000 A to 4000 A. The first photoresist film 23 is a positive photoresist.

S102, as shown in FIG. 2B, exposing the first photoresist film 23, the first metal film 22, and the light-shielding film 21 by using a first photomask 100.

The first photomask 100 includes a fully transparent region 100a, a partially transparent region 100b, and a non-transparent region 100c. The first photomask 100 is disposed over the substrate 11 on which the light-shielding film 21, the first metal film 22, and the first photoresist film 23 are laminated. The non-transparent region 100c corresponds to a region where the source and the drain are to be formed. The partially transparent region 100b corresponds to a region between the source to be formed and the drain to be formed. The fully transparent region 100a corresponds to a region beyond the light-shielding layer to be formed.

S103, as shown in FIG. 2B-FIG. 2D, removing regions of the first photoresist film 23 and the first metal film 22 corresponding to the fully transparent region 100a and the partially transparent region 100b to form the source 13 and the drain 14, respectively.

Specifically, as shown in FIG. 2C, the first photoresist film 23 is developed after exposing, and a region of the first photoresist film 23 corresponding to the fully transparent region 100a and the partially transparent region 100b is removed to form a first photoresist pattern 231.

As shown in FIG. 2D, a region of the first metal film 22 where is not covered by the first photoresist pattern 231 is removed by a wet etching process via a corrosive solution (e.g., PPC acid, ENF acid, oxalic acid, etc.) to form the source 13 and the drain 14, respectively.

S104, as shown in FIG. 2B and FIG. 2E, removing a region of the light-shielding film 21 corresponding to the fully transparent region 100a to form the light-shielding layer 12.

Specifically, a region of the light-shielding film 21 beyond the light-shielding layer 12 may be removed by a dry etching process.

The source 13 and the drain 14 of the present embodiment directly contact the light-shielding layer 12. If the light-shielding layer 12 is made of a metal material, the source 13 and the drain 14 are directly conductive, which affects normal use of the device.

S105, removing a remaining portion of the first photoresist film.

Specifically, as shown in FIG. 2F, the first photoresist pattern 231 may be ashed by an oxidizing gas (such as $O_2$ and $N_2O$, etc.) to remove.

In this embodiment, the light-shielding layer 12, the source 13 and the drain 14 on the light-shielding layer 12 can be formed and patterned by only the first photomask process. Compared with the conventional manufacturing process, the above manufacturing method of this embodiment can save the use of another photomask.

S2, forming a semiconductor layer, a gate insulating layer, and a gate which are laminated on the source, the drain, and the light-shielding layer by a second photomask process.

Wherein the S2 comprises the following steps S201-S206:

S201, as shown in FIG. 2G, forming a semiconductor film 24 on the source 13, the drain 14, the light-shielding layer 12, and the substrate 11; wherein the semiconductor film 24 includes a conductive region 24a corresponding to the source 13 and the drain 14.

A material of the semiconductor film 24 may be one of indium gallium zinc oxide (IGZO), indium zinc tin oxide (IZTO), or indium gallium zinc tin oxide (IGZTO). A thickness of the semiconductor film 24 ranges from 100 A to 1000 A.

S202, as shown in FIG. 2H, conducting a portion of the semiconductor film 24 corresponding to the conductive region 24a to form a conductor region 152.

Specifically, a conductor region 152 is formed by conducting a portion of the semiconductor film 24 corresponding to the conductor region 24a via laser or ion doping.

S203, as shown in FIG. 2I, laminating a gate insulating film 25, a second metal film 26, and a second photoresist film 27 sequentially on the semiconductor film 24.

A material of the gate insulating film 25 may be at least one of silicon oxide and silicon nitride, and a thickness of the gate insulating film 25 ranges from 1000 A to 3000 A. A material of the second metal film 26 may be at least one of molybdenum, aluminum, copper, and titanium, and a thickness of the second metal film 26 ranges from 2000 A to 4000 A. The second photoresist film 27 is a positive photoresist.

S204, as shown in FIG. 2J, exposing the second photoresist film 27, the second metal film 26, the gate insulating film 25, and the semiconductor film 24 by using a second photomask 200.

Wherein the second photomask 200 includes a fully transparent region 200a and a non-transparent region 200b. The second photomask 200 is disposed over the substrate 11 on which the second photoresist film 27, the second metal film 26, the gate insulating film 25, and the semiconductor film 24 are laminated. The non-transparent region 200b corresponds to a region where a semiconductor layer, a gate insulating layer, and a gate are to be formed, and the fully transparent region 200a corresponds to a region beyond the region where a semiconductor layer, a gate insulating layer, and a gate are to be formed.

S205, as shown in FIG. 2J-FIG. 2M, removing regions of the second photoresist film 27, the second metal film 26, the gate insulating film 25, and the semiconductor film 24 corresponding to the fully transparent region 200a to form the gate 17, the gate insulating layer 16, and the semiconductor layer 15, respectively.

Specifically, as shown in FIG. 2K, the second photoresist film 27 is developed after exposing, and a region of the second photoresist film 27 corresponding to the fully transparent region 200a is removed to form a second photoresist pattern 271.

As shown in FIG. 2L, a region of the second metal film 26 where is not covered by second photoresist patterns 271 is removed by a wet etching process via a corrosive solution (e.g., PPC acid, ENF acid, oxalic acid, etc.) to form the gate 17.

As shown in FIG. 2M, regions of the gate insulating film 25 and the semiconductor film 24 where are not covered by the gate 17 are removed by a dry etching process to form the gate insulating layer 16 and the semiconductor layer 15, respectively. The gate insulating film 25 and the semiconductor film 24 may be etched by one etching process, or may be etched by two etching processes.

S206, removing a remaining portion of the second photoresist film.

Specifically, as shown in FIG. 2N, the second photoresist pattern 27 may be ashed by an oxidizing gas (such as $O_2$ and $N_2O$, etc.) to remove.

Wherein the gate 17, the gate insulating layer 16, and the semiconductor layer 15 formed by the second photomask 200 are shaped in a stacked structure (15,16,17) in a direction perpendicular to the substrate 11, and the edge of the stacked structure (15,16,17) may be overlapped with the source 13 and the drain 14.

Further, orthographic projections of the gate 17, the gate insulating layer 16, and the semiconductor layer 15 on the substrate 11 are in an orthographic projection of the light-shielding layer 12 on the substrate 11. Wherein the orthographic projections of the gate insulating layer 16 and the gate 17 on the substrate 11 are in of the orthographic projection of the semiconductor layer 15 on the substrate 11. At least, the edge of the semiconductor layer 15 is overlapped with the source 13 and the drain 14.

In this embodiment, the edges of the semiconductor layer 15, the gate insulating layer 16, and the gate 17 are overlapped with the source 13 and the drain 14, wherein the semiconductor layer 15, the gate insulating layer 16, and the gate 17 are formed by using a same photomask. Thus, it is prevented a contact area between the conductor region 152 and the source 13, and a contact area between the conductor region 152 and the drain 14 from being too small, thereby increasing the reliability of a contact between the conductor region 152 and the source 13, and a contact between the conductor region 152 and the drain 14, and reducing a contact impedance as much as possible.

In this embodiment, the gate 17, the gate insulating layer 16, and the semiconductor layer 15 can be formed and patterned by only the second photomask process. Compared with the conventional manufacturing process, the above manufacturing method of this embodiment can save the use of another photomask.

S3, as shown in FIG. 2O, forming a dielectric layer 18 on the gate 17 and the substrate 11, and forming a via hole 181 exposing the drain 14 on the dielectric layer 18 by a third photomask process.

Wherein a material of the dielectric layer 18 may be at least one of silicon oxide and silicon nitride, and a thickness of the dielectric layer 18 ranges from 5000 A to 8000 A. The dielectric layer 18 completely covers the thin film transistor.

Specifically, the drain 14 includes a first contact region 141 and a second contact region 142, the first contact region 141 is spaced apart from the second contact region 142, and the second contact region 142 is located on a side of the first contact region 141 away from the source 13. It should be understood that a via hole 181 formed in the dielectric layer 18 by the third photomask process exposes the second contact region 142.

S4, as shown in FIG. 2P-FIG. 2Q, forming a pixel electrode 19 on the dielectric layer 18 by a fourth photomask process. The pixel electrode 19 is electrically connected to the drain 14 through the via hole 181.

Specifically, as shown in FIG. 2P, an electrode film 28 is formed on the dielectric layer 18. The electrode film 28 is made of a transparent material and may be indium gallium zinc oxide (IGZO), but is not limited thereto. A thickness of the electrode film 28 ranges from 2000 A to 4000 A.

As shown in FIG. 2Q, after the fourth photomask process, a pixel electrode 19 is formed and pattern by the electrode film 28, and the pixel electrode 19 is electrically connected to the drain 14 through the via hole 181. As described above, the processes for manufacturing the array substrate are completed. Further, the first contact region 141 is spaced apart from the second contact region 142 due to the third contact region 143 therebetween.

According to the manufacturing method for array substrate provided in the embodiments of the present disclosure, a light-shielding layer, a source and a drain are formed by a first photomask process; a semiconductor layer, a gate insulating layer and a gate which are laminated are formed by a second photomask process; a via hole exposing a drain is formed on a dielectric layer by a third photomask process; and a pixel electrode is formed by a fourth photomask process. According to the present disclosure, since the source, the drain and the light-shielding layer are formed by using a same photomask, another photomask process can be saved. Meanwhile, the semiconductor layer, the gate insulating layer, and the gate are also formed by using a same photomask, thus, another photomask process can be saved. Therefore, the present disclosure can complete the processes for manufacturing the array substrate only by four photomask processes, thereby reducing the number of photomasks used, simplifying the manufacturing process, and reducing the production cost.

Figure 3:
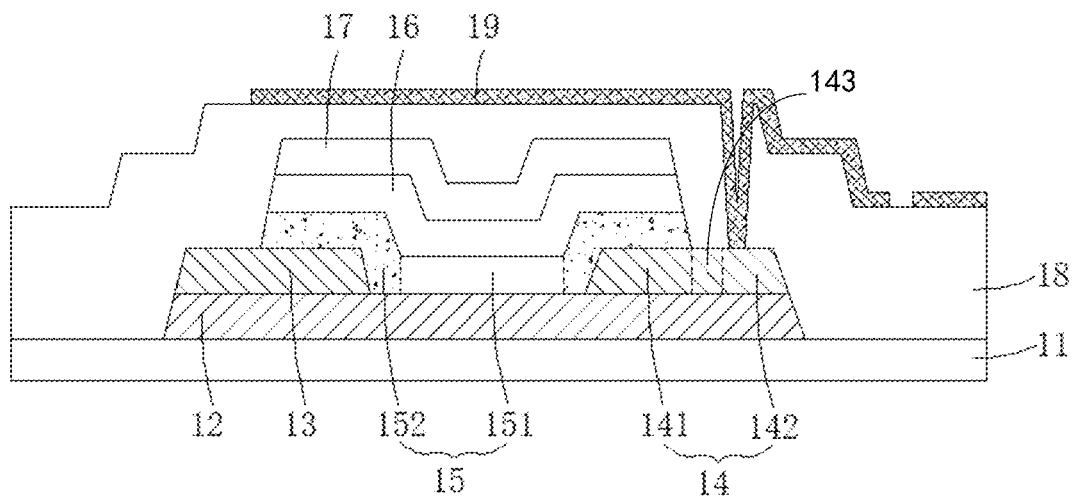
FIG. 3 is a schematic structural diagram of an array substrate according to an embodiment of the present disclosure.

Referring to FIG. 3, an embodiment of the present disclosure provides an array substrate, wherein the array panel can be applied to, but not limited to, a liquid crystal display panel. The array substrate includes a substrate 11; a source 13 disposed on the substrate 11; a drain 14 disposed on the substrate 11 and in a same layer with the source 13, wherein the drain 14 is spaced apart from the source 13; a semiconductor layer 15 disposed between the source 13 and the drain 14 and provided with an edge extended to a side of the source 13 and the drain 14 away from the substrate 11; a gate insulating layer 16 disposed on a side of the semiconductor layer 15 away from the substrate 11; and a gate 17 disposed on a side of the gate insulating layer 16 away from the substrate 11. Wherein the gate 17, the gate insulating layer 16, and the semiconductor layer 15 are shaped in a stacked structure in a direction perpendicular to the substrate 11, and an edge of the stacked structure is overlapped with the source 13 and the drain 14.

The structure of the array substrate provided in this embodiment is simple, the manufacturing process can be simplified, and the production cost can be reduced. The specific structure of the array substrate is described below.

Referring to FIG. 3, the array substrate 1 includes a substrate 11, a light-shielding layer 12, a source 13, a drain 14, a semiconductor layer 15, a gate insulating layer 16, a gate 17, a dielectric layer 18, and a pixel electrode 19 subsequently from bottom to top.

The substrate 11 may be a rigid glass substrate or a flexible polyimide substrate, which is not limited herein.

A plurality of the light-shielding layers 12 are spaced apart from each other on the substrate 11. The light-shielding layer 12 is a non-metallic material, for example, a black matrix material, to shield the lights emitting from a side of the substrate 11 to the semiconductor layer 15.

The source 13 and the drain 14 are disposed on a side of the light-shielding layer 12 away from the substrate 11, and the source 13 is spaced apart from the drain 14. Specifically, both the source 13 and the drain 14 are located on the surface of the light-shielding layer 12 away from the substrate 11, and are disposed opposite to each other at two ends of the light-shielding layer 12. The source 13 and the drain 14 of the present embodiment are directly contact the light-shielding layer 12. If the light-shielding layer 12 is made of a metal material, the source 13 and the drain 14 are directly conductive, which affects normal use of the device.

The semiconductor layer 15 is disposed on the source 13, the drain 14, and a surface of the light-shielding layer 12 away from the substrate 11 and exposed between the source 13 and the drain 14. The gate insulating layer 16 is disposed on a side of the semiconductor layer 15 away from the substrate 11, and the gate layer 17 is disposed on a side of the gate insulating layer 16 away from the substrate 11. The dielectric layer 18 is disposed on the gate 17 and the substrate 11, that is, the dielectric layer 18 is disposed on an entire surface of the dielectric layer 18, and is provided with a via hole penetrating the dielectric layer 18 at positions corresponding to the drain 14. The pixel electrode 19 is provided on a side of the dielectric layer 18 away from the substrate 11, and is electrically connected to the drain 14 through the via hole.

The source 13, the drain 14, the semiconductor layer 15, and the gate 17 constitute a thin film transistor. The orthographic projections of the source 13, the drain 14, the semiconductor layer 15, the gate insulating layer 16, and the gate 17 on the substrate 11 are in the orthographic projection of the light-shielding layer 12 on the substrate 11.

Further, the semiconductor layer 15, the gate insulating layer 16, and the gate 17 are shaped in a stacked structure (15, 16, 17), wherein the edge of the stacked structure is overlapped with the source 13 and the drain 14 in a direction perpendicular to the substrate 11.

Wherein the orthographic projections of the gate insulating layer 16 and the gate 17 on the substrate 11 are in the orthographic projection of the semiconductor layer 15 on the substrate 11. Further, the orthographic projection of the gate 17 on the substrate 11 is in the orthographic projection of the gate insulating layer 16 on the substrate 11.

In an embodiment, a side surface of the stacked structure (15, 16, 17) shaped by the semiconductor layer 15, the gate insulating layer 16, and the gate 17 is inclined at a preset angle to a plane where the substrate 11 is located. Wherein the preset angle ranges from 20° to 90°, for example, the preset angle may be 30°, 45°, 60°, 75°, or the like. Optionally, the edges of the semiconductor layer 15, the gate insulating layer 16, and the gate 17 are disposed flush in a direction perpendicular to the substrate 11.

In the present embodiment, the edges of the semiconductor layer 15, the gate insulating layer 16, and the gate 17 are overlapped with the source 13 and the drain 14. In this way, it is ensured to prevent the contact area between the conductor region 152 and the source 13, and the contact area between the conductor region 152 and the drain 14 from being too small, thereby increasing the reliability of the contact between the conductor region 152 and the source 13, and the contact between the conductor region 152 and the drain 14, and reducing a contact impedance as much as possible.

The semiconductor layer 15 includes a channel region 151 and a conductor region 152, wherein the channel region 151 is correspondingly located between the source 13 and the drain 14, and the conductor region 152 is located on both sides of the channel region 151. The conductor regions 152 located on both sides of the channel region 151 contact the source 13 and the drain 14, respectively, for electrical connection.

Wherein the conductor region 152 corresponding to the source 13 contacts the light-shielding layer 12 along a surface of a side of the source 13 away from the substrate 11 to a surface of a side of the source 13 close to the drain 14. The conductor region 152 corresponding to the drain 14 contacts the light-shielding layer 12 along a surface of a side of the drain 14 away from the substrate 11 to a surface of a side of the drain 14 close to the source 13. In this way, the contact area between the conductor region 152 and the source 13, and the contact area between the conductor region 152 and the drain 14 can be ensured to minimize the contact impedance between the semiconductor layer 15 and the source 13, and the contact impedance between the semiconductor layer 15 and the drain 14 as much as possible.

Wherein the drain 14 includes a first contact region 141 and a second contact region 142, the first contact region 141 is spaced apart from the second contact region 142, and the second contact region 142 is located on a side of the first contact region 141 away from the source 13. Wherein the conductor region 152 of the semiconductor layer 15 contacts the first contact region 141, and a portion of the pixel electrode 19 which is in the via hole 181 contacts the second contact region 142 through the via hole. The drain 14 further includes a third contact region 143. The third contact region 143 is disposed between the first contact region 141 and the second contact region 142, and is in contact with the dielectric layer 18. Since the first contact region 141 is spaced apart from the second contact region 142_due to the third contact region 143 therebetween, the connection portion of the pixel electrode 19 located in the via hole does not contact the conductor region 152 of the semiconductor layer 15 directly, thereby avoiding influences on the thin film transistor.

In this embodiment, the conductor region 152 of the semiconductor layer 15 may completely cover the source 13 or may partially cover the source 13 in a direction perpendicular to the substrate 11. In order to ensure good working performance of the semiconductor layer 15, the contact area between the conductor region 152 and the source 13 is consistent with the contact area between the conductor region 152 and the drain 14.

It can be understood that the array substrate 1 according to the embodiment of the present disclosure may further include other conventional film layers, for example, may further include a buffer layer located between the substrate 11 and the light-shielding layer 12, may further include a planarization layer located on a side of the pixel electrode 19 away from the substrate 11, and the like, and details are not described herein.

The embodiments of the present disclosure are described in detail above. The principles and implementation modes of the present disclosure are described herein by applying specific examples. The description of the above embodiments is only used to help understand the method and core idea of the present disclosure. At the same time, for those skilled in the art, according to the idea of the present disclosure, there will be some changes in the specific embodiment and disclosure scope. In conclusion, the contents of this specification shall not be construed as limiting the present disclosure.

What is claimed is:

1. 1. A manufacturing method for array substrate, comprising:
    S1, providing a substrate; and forming a light-shielding layer on the substrate, and a source and a drain on a side of the light-shielding layer away from the substrate by a first photomask process;
    S2, forming a semiconductor layer, a gate insulating layer, and a gate which are laminated on the source, the drain, and the light-shielding layer by a second photomask process;
    S3, forming a dielectric layer on the gate and the substrate, and forming a via hole exposing the drain on the dielectric layer by a third photomask process; and
    S4, forming a pixel electrode on the dielectric layer by a fourth photomask process, wherein the pixel electrode is electrically connected to the drain through the via hole.

2. The manufacturing method of claim 1, wherein the S1 comprises:
    S101, laminating a light-shielding film, a first metal film, and a first photoresist film sequentially on the substrate;
    S102, exposing the first photoresist film, the first metal film, and the light-shielding film by using a first photomask; wherein the first photomask includes a fully transparent region, a partially transparent region, and a non-transparent region;
    S103, removing regions of the first photoresist film and the first metal film corresponding to the fully transparent region and the partially transparent region to form the source and the drain, respectively;
    S104, removing a region of the light-shielding film corresponding to the fully transparent region to form the light-shielding layer; and
    S105, removing a remaining portion of the first photoresist film.

3. The manufacturing method of claim 2, wherein a material of the light-shielding layer is a non-metallic light-shielding material.

4. The manufacturing method of claim 2, wherein the S2 comprises:
    S201, forming a semiconductor film on the source, the drain, the light-shielding layer, and the substrate; wherein the semiconductor film includes a conductive region corresponding to the source and the drain;
    S202, conducting a portion of the semiconductor film corresponding to the conductive region to form a conductor region;
    S203, forming a gate insulating film, a second metal film, and a second photoresist film sequentially on the semiconductor film;
    S204, exposing the second photoresist film, the second metal film, the gate insulating film, and the semiconductor film by using a second photomask; wherein the second photomask includes a fully transparent region and a non-transparent region;
    S205, removing regions of the second photoresist film, the second metal film, the gate insulating film, and the semiconductor film corresponding to the fully transparent region to form the gate, the gate insulating layer, and the semiconductor layer, respectively; and
    S206, removing a remaining portion of the second photoresist film.

5. The manufacturing method of claim 4, wherein the gate, the gate insulating layer, and the semiconductor layer are shaped in a stacked structure in a direction perpendicular to the substrate, and an edge of the stacked structure is overlapped with the source and the drain;

wherein orthographic projections of the gate insulating layer and the gate on the substrate are in an orthographic projection of the semiconductor layer on the substrate.

6. An array substrate, comprising:
a substrate;
a source disposed on the substrate;
a drain disposed on the substrate and in a same layer with the source, wherein the drain is spaced apart from the source;
a semiconductor layer disposed between the source and the drain, and provided with an edge extended to a side of the source away from the substrate and a side of the drain away from the substrate;
a gate insulating layer disposed on a side of the semiconductor layer away from the substrate; and
a gate disposed on a side of the gate insulating layer away from the substrate;
wherein the gate, the gate insulating layer, and the semiconductor layer are shaped in a stacked structure in a direction perpendicular to the substrate, and an edge of the stacked structure is overlapped with the source and the drain;
wherein the array substrate further comprises a light-shielding layer between the substrate and the source, and between the substrate and the drain; the source and the drain are disposed on a side of the light-shielding layer away from the substrate;
wherein the semiconductor layer comprises a channel region and a conductor region, the channel region is correspondingly located between the source and the drain, the conductor region is located on both sides of the channel region and contacts the source and the drain, respectively;
wherein the conductor region corresponding to the source contacts the light-shielding layer along a surface of the side of the source away from the substrate to a surface of a side of the source close to the drain; the conductor region corresponding to the drain contacts the light-shielding layer along a surface of the side of the drain away from the substrate to a surface of a side of the drain close to the source.

7. The array substrate of claim 6, wherein edges of the semiconductor layer, the gate insulating layer, and the gate are overlapped with the source and drain in the direction perpendicular to the substrate.

8. The array substrate of claim 7, wherein orthographic projections of the gate insulating layer and the gate on the substrate are in an orthographic projection of the semiconductor layer on the substrate.

9. The array substrate of claim 8, wherein the orthographic projection of the gate on the substrate is in the orthographic projection of the gate insulating layer on the substrate.

10. The array substrate of claim 6, wherein the array substrate further comprises a dielectric layer and a pixel electrode, the dielectric layer is disposed on a side of the gate away from the substrate, and the pixel electrode is disposed on a side of the dielectric layer away from the substrate;

wherein the drain includes a first contact region and a second contact region, the second contact region is located on a side of the first contact region away from the source, the conductor region corresponding to the drain contacts the first contact region, the dielectric layer comprises a via hole spaced apart from the conductor region, and a portion of the pixel electrode which is in the via hole contacts the second contact region.

11. The array substrate of claim 10, wherein the drain further comprises a third contact region, the third contact region is disposed between the first contact region and the second contact region and in contact with the dielectric layer, and the first contact region is spaced apart from the second contact region through the third contact region.

12. The array substrate of claim 6, wherein a material of the light-shielding layer is a non-metallic light-shielding material.

13. The array substrate of claim 12, wherein the material of the light-shielding layer is a black matrix.

14. A liquid crystal display panel comprising a array substrate, the array substrate comprising
a substrate;
a source disposed on the substrate;
a drain disposed on the substrate and in a same layer with the source, wherein the drain is spaced apart from the source;
a semiconductor layer disposed between the source and the drain, and provided with an edge extended to a side of the source away from the substrate and a side of the drain away from the substrate;
a gate insulating layer disposed on a side of the semiconductor layer away from the substrate; and
a gate disposed on a side of the gate insulating layer away from the substrate;
wherein the gate, the gate insulating layer, and the semiconductor layer are shaped in a stacked structure in a direction perpendicular to the substrate, and an edge of the stacked structure is overlapped with the source and the drain;
wherein the array substrate further comprises a light-shielding layer between the substrate and the source, and between the substrate and the drain; the source and the drain are disposed on a side of the light-shielding layer away from the substrate;
wherein the semiconductor layer comprises a channel region and a conductor region, the channel region is correspondingly located between the source and the drain, the conductor region is located on both sides of the channel region and contacts the source and the drain, respectively;
wherein the conductor region corresponding to the source contacts the light-shielding layer along a surface of the side of the source away from the substrate to a surface of a side of the source close to the drain; the conductor region corresponding to the drain contacts the light-shielding layer along a surface of the side of the drain away from the substrate to a surface of a side of the drain close to the source.

15. The liquid crystal display panel of claim 14, wherein a material of the light-shielding layer is a non-metallic light-shielding material.

16. The liquid crystal display panel of claim 14, wherein the array substrate further comprises a dielectric layer and a pixel electrode, the dielectric layer is disposed on a side of the gate away from the substrate, and the pixel electrode is disposed on a side of the dielectric layer away from the substrate;

wherein the drain includes a first contact region and a second contact region, the second contact region is located on a side of the first contact region away from the source, the conductor region corresponding to the drain contacts the first contact region, the dielectric layer comprises a via hole spaced apart from the conductor region, and a portion of the pixel electrode which is in the via hole contacts the second contact region.

17. The liquid crystal display panel of claim 16, wherein the drain further comprises a third contact region, the third contact region is disposed between the first contact region and the second contact region and in contact with the dielectric layer, and the first contact region is spaced apart from the second contact region through the third contact region.

18. The liquid crystal display panel of claim 14, wherein edges of the semiconductor layer, the gate insulating layer, and the gate are overlapped with the source and drain in the direction perpendicular to the substrate.

19. The liquid crystal display panel of claim 18, wherein orthographic projections of the gate insulating layer and the gate on the substrate are in an orthographic projection of the semiconductor layer on the substrate.

20. The liquid crystal display panel of claim 19, wherein the orthographic projection of the gate on the substrate is in the orthographic projection of the gate insulating layer on the substrate.

\* \* \* \* \*